United States Patent [19]
Susak et al.

[11] Patent Number: 5,912,593
[45] Date of Patent: Jun. 15, 1999

[54] IC (CURRENT-CAPACITOR) PRECISION OSCILLATOR HAVING FREQUENCY AND DUTY CYCLE CONTROLS

[75] Inventors: David M. Susak, Phoenix; Scott Ellison, Chandler, both of Ariz.

[73] Assignee: Microchip Technology, Incorporated, Chandler, Ariz.

[21] Appl. No.: 08/871,334

[22] Filed: Jun. 9, 1997

[51] Int. Cl.$^6$ ................................ H03K 3/00; H03B 5/00
[52] U.S. Cl. .................... 331/111; 331/DIG. 3; 331/175; 331/143; 327/131; 327/132; 327/134; 327/135
[58] Field of Search .................................. 327/175, 176, 327/131, 132, 134, 135; 331/111, DIG. 3, 144, 143

[56] References Cited

U.S. PATENT DOCUMENTS

| | | | |
|---|---|---|---|
| 4,983,931 | 1/1991 | Nakano | 331/111 |
| 5,699,024 | 12/1997 | Manlove et al. | 331/111 |

Primary Examiner—Arnold Kinkead
Attorney, Agent, or Firm—Harry M. Weiss; Jeffrey D. Moy; Harry M. Weiss & Associates, P.C.

[57] ABSTRACT

A precision oscillator circuit having a wide adjustable operating frequency range and an adjustable duty cycle. The precision oscillator use a window comparator circuit for monitoring a voltage of a capacitive element. The window comparator circuit has a first operating voltage edge and a second operating voltage edge wherein the first operating voltage edge latches an output signal of the window comparator circuit at one level when the voltage of the capacitive element is greater than the first operating voltage edge. The second operating voltage edge brings the output signal of the window comparator circuit back to an initial level when the voltage of the capacitive element is greater than the second operating voltage edge. A precision current reference source is coupled to the capacitive element and to the window comparator circuit. The precision current reference is used for generating currents which are insensitive to temperature, supply voltage, and process variations. The currents are used for charging and discharging the capacitive element. The currents are adjustable in order to vary an amount of time it takes to charge and discharge the capacitive element. This allows for the altering of the frequency as well as the duty cycle of the output signal of the window comparator circuit.

26 Claims, 2 Drawing Sheets

IC (CURRENT-CAPACITOR) PRECISION OSCILLATOR HAVING FREQUENCY AND DUTY CYCLE CONTROLS

BACKGROUND OF THE INVENTION

1. Field of the Invention

This invention relates generally to oscillators and, more specifically, to an IC (current-capacitor) precision oscillator which allows the user to have control over the frequency and the duty cycle of the precision oscillator by altering an input current of the precision oscillator.

2. Description of the Prior Art

Oscillator circuits are used in a myriad of applications in the electronics industry for providing clock and other timing signals to electronic circuitry such as microprocessors, microcontrollers, flip-flop circuits, latch circuits, etc. Typical oscillator circuits include a control circuit coupled to an interconnection between a series resistor-capacitor (RC) network (i.e., RC oscillator). The control circuit alternately charges or discharges the voltage across the capacitor through the resistor to generate an oscillatory signal appearing across the capacitor. The frequency of oscillation is determined by the time constant of the resistor and the capacitor.

One technique for building an RC oscillator is to use a conventional NE555 timer (hereinafter the 555 timer), manufactured by National Semiconductor, as the circuit that controls the charging and discharging of the capacitor of the RC network. The 555 timer includes a set/reset (SR) flip-flop and first and second comparators. The interconnection between the series RC network is coupled to one input of each of the comparators. The other input of the first comparator is coupled to receive a high threshold voltage ($V_H$) while the other input of the second comparator is coupled to receive a low threshold voltage ($V_L$). The output of the first comparator is coupled to the set input of the flip-flop while the output of the second comparator is coupled to the reset input of the flip-flop. An output of the flip-flop is coupled to the resistor of the RC network.

In operation, the first comparator sets the flip-flop, which commences the discharging of the voltage across the capacitor, when the RC oscillatory signal exceeds the predetermined high threshold voltage, and the second comparator resets the flip-flop, which commences the charging of the voltage across the capacitor, when the RC oscillatory signal falls below the predetermined low threshold voltage. In this manner, the signal appearing across the capacitor approximately oscillates between the high and the low threshold voltages at a frequency determined by the value of the resistor capacitor of the RC network.

The problem with the above embodiment is that the configuration suffers from the drawback that by the time the flip-flop is set (or reset) in response to the switching of one of the comparators, the RC oscillatory signal has actually risen above the high threshold voltage (in the case of setting the flip-flop) or has fallen below the low threshold voltage (in the case of resetting the flip-flop). As a result, variations in the frequency of oscillation occur because the RC oscillatory signal does not accurately oscillate between the desired high and low threshold voltages. Such error is unacceptable when an accurate oscillatory signal is required.

Present RC oscillators also do not allow the user to vary the duty cycle. Furthermore, current RC oscillators do not have very broad operating frequency ranges. In order to broaden the operating frequency range of present RC oscillators, significant changes to the RC network would have to be made.

Therefore, a need existed to provide an improved oscillator. The improved oscillator must be a precision oscillator. The precision oscillator must generate an output frequency which varies within +/– 3% of the desired frequency level. The precision oscillator must have a wide programmable frequency range without requiring significant changes to the circuitry of the precision oscillator. The precision oscillator must also allow for an adjustable duty cycle.

SUMMARY OF THE INVENTION

In accordance with one embodiment of the present invention, it is an object of this invention to provide an improved oscillator.

It is another object of the present invention to provide an improved oscillator that is a precision oscillator.

It is another object of the present invention to provide a precision oscillator that generates an output frequency which varies within +/– 3% of the desired frequency level.

It is still another object of the present invention to provide a precision oscillator that has a wide programmable frequency range.

It is still another object of the present invention to provide a precision oscillator that has a wide programmable frequency range without requiring significant changes to the circuitry of the precision oscillator.

It is still a further object of the present invention to provide a precision oscillator that has an adjustable duty cycle.

BRIEF DESCRIPTION OF THE PREFERRED EMBODIMENTS

In accordance with one embodiment of the present invention, a precision oscillator circuit having a wide adjustable operating frequency range and an adjustable duty cycle is disclosed. The precision oscillator has a capacitive element which is charged and discharged. A window comparator circuit is coupled to the capacitive element for monitoring a voltage of the capacitive element. The window comparator circuit has a first operating voltage edge and a second operating voltage edge wherein the first operating voltage edge latches an output signal of the window comparator circuit at one level when the voltage of the capacitive element is greater than the first operating voltage edge. The second operating voltage edge of the window comparator circuit brings the output signal of the window comparator circuit back to an initial level when the voltage of the capacitive element is greater than the second operating voltage edge. A precision current reference source is coupled to the capacitive element and to the window comparator circuit for generating currents which are insensitive to temperature, supply voltage, and process variations. The currents are used for charging and discharging the capacitive element. The currents generated by the precision current reference source are adjustable in order to vary an amount of time it takes to charge and discharge the capacitive element. This allows for the altering of the frequency as well as the duty cycle of the output signal of the window comparator circuit.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
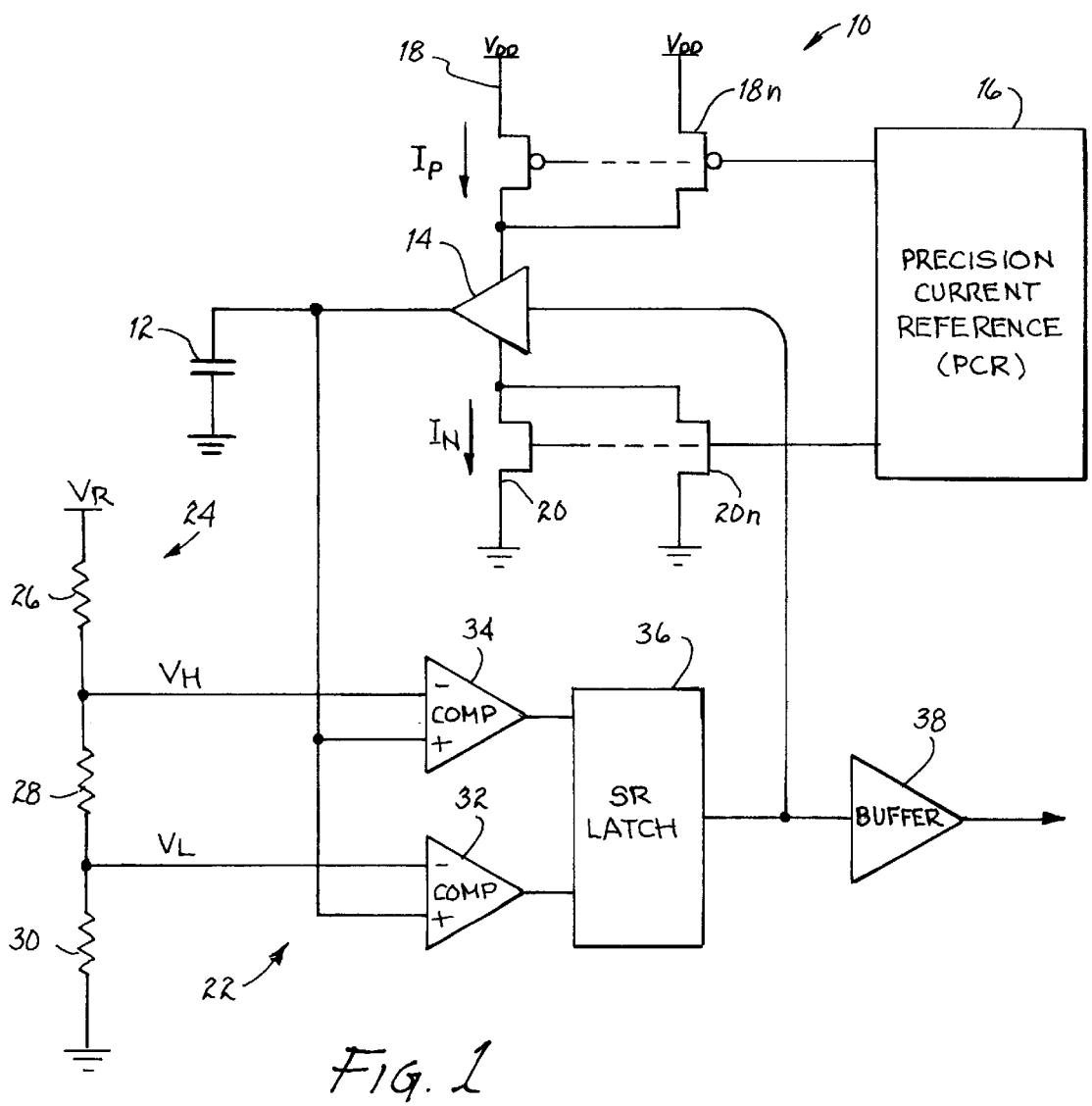
FIG. 1 is a simplified electrical schematic of the precision oscillator circuit of the present invention.

Referring to FIG. 1, a precision oscillator with frequency and duty cycle controls 10 (hereinafter precision oscillator 10) is shown. The precision oscillator 10 uses the concept of switching a known precision current in to and out of a capacitor 12. The current must be controlled to within +/- 2% and have a zero temperature coefficient.

The switching is accomplished by using a simple inverter 14. The precision current is generated by a current generator 16 which can control the current to within +/- 2% and have a zero temperature coefficient. In the preferred embodiment of the present invention, the precision current is generated with a precision bandgap voltage reference.

The inverter 14 switches between two currents $I_P$ and $I_N$. The two currents are used for charging $I_P$ and discharging $I_N$ the capacitor 12. Both currents are adjustable currents and are insensitive to temperature, supply voltage, and process variations.

As stated above, the current generator 16 is used for generating a current which is insensitive to temperature, supply voltage, and process variations. In order to control the two currents $I_P$ and $I_N$, at least one P-channel transistor 18 and at least one N-channel transistor 20 are coupled to the current generator 16.

The P-channel transistor 18 has drain, gate, and source terminals. The source terminal of the P-channel transistor 18 is coupled to a bias voltage source $V_{DD}$. The gate terminal of the P-channel transistor 18 is coupled to the current generator 16. The drain terminal of the P-channel transistor 18 is coupled to the inverter 14. The P-channel transistor 18 is used for regulating the level of the current $I_P$ which is used for charging the capacitor 12. Additional P-channel transistors 18n may be provided in order to increase the level of the current $I_P$. Each additional P-channel transistor 18n will also have drain, gate, and source terminals. Each additional P-channel transistor 18n will be coupled in a similar manner wherein the source terminals of each additional P-channel transistor 18n are coupled to the bias voltage source $V_{DD}$, the gate terminals of each additional P-channel transistor 18n are coupled to the current generator 16, and the drain terminals of each additional P-channel transistor 18n are coupled to the inverter 14. By turning on or turning off the P-channel transistors 18 and 18n, one may regulate the level of the current $I_P$ which is used to charge the capacitor 12.

The N-channel transistor 20 regulates the level of the current $I_N$ which is used to discharge the capacitor 12. The N-channel transistor 20 has drain, gate, and source terminals. The drain terminal of the N-channel transistor 20 is coupled to the inverter 14. The gate terminal of the N-channel transistor 20 is coupled to the current generator 20. The source terminal of the N-channel transistor 20 is coupled to ground. Additional N-channel transistors 20n may be used to increase the level of the current $I_N$. Each additional N-channel transistor 20n will also have drain, gate, and source terminals and are coupled in a similar manner as the N-channel transistor 20. The drain terminals of each additional N-channel transistor 20n are coupled to the invertor 14. The gate terminals of each additional N-channel transistor 20n are coupled to the current generator 16. The source terminals of each additional N-channel transistor 20n are coupled to ground. By turning on or turning off the N-channel transistors 20 and 20n, one may regulate the level of the current $I_n$ which is used to discharge the capacitor 12.

A window comparator 22 is coupled to the capacitor 12. The window comparator 22 is used for monitoring the voltage of the capacitor 12. The window comparator 22 has two operating voltage edges $V_L$ and $V_H$. When the voltage of the capacitor reaches the first operating voltage edge $V_L$, the window comparator 22 latches the output signal of the window comparator 22 at a high level. When the voltage of the capacitor 12 reaches the second voltage edge $V_H$, the window comparator 22 brings the output signal of the window comparator 22 back down to an initial starting level. The output of the window comparator 22 is the desired frequency and can be run through a buffer 38 to drive larger loads. The output of the window comparator 22 is also fed back to the inverter 14. The output signal from the window comparator 22 is used to control the switching of the inverter 14 in order to charge and discharge the capacitor 12.

In the embodiment shown in FIG. 1, the window comparator 22 uses a resistive ladder 24 to set the two operating voltage edges $V_L$ and $V_H$. The resistive ladder 24 is comprised of three resistors 26, 28, and 30. The first resistor 26 has a first terminal which is coupled to a voltage source $V_R$ and a second terminal coupled to a first terminal of the second resistor 28. The second terminal of the second resistor 28 is coupled to the first terminal of the third resistor 30. The second terminal of the third resistor 30 is grounded. All three resistors 26, 28, and 30 may be variable type resistors. This will allow the user of the precision oscillator 10 to adjust the two operating voltage edges $V_L$ and $V_H$ of the window comparator 22.

The charging and discharging of the capacitor 12 will generate a triangular waveform which is inputted to two comparators 32 and 34. The first comparator 32 generates an output signal when the voltage of the capacitor 12 is greater than the first operating voltage edge $V_L$ which is set by the resistive ladder 24. The output signal from the first comparator 32 sets the output of a latch 36. When the voltage of the capacitor 12 reaches the second voltage edge $V_H$, the second comparator 34 will generate an output signal which resets the latch 36 forcing the output of the latch back to an initial starting value. The output of the latch 36 is the desired frequency and can be run through a buffer 38 to drive larger loads. The output of the latch 36 is also fed back to the inverter 14. The output signal from the latch 36 is used to control the switching of the inverter 14 in order to charge and discharge the capacitor 12.

By adding or deleting P-channel transistors 18 and 18n and/or N-channel transistors 20 and 20n (i.e., adding or deleting current from $I_P$ and $I_N$), the frequency and/or the duty cycle of the precision oscillator 10 may be adjusted. The frequency of the precision oscillator 10 may be adjusted by simply changing the currents $I_P$ and $I_N$ by the same amount. The duty cycle of the precision oscillator 10 may be accurately adjusted by keeping the sum of the currents $I_P$ and $I_N$ constant ($I_C = I_P + I_N$) and increasing one current while decreasing the other (i.e., increasing $I_P$ and decreasing $I_N$ or decreasing $I_P$ and increasing $I_N$ both while maintaining a constant sum $I_C$.

Figure 2:
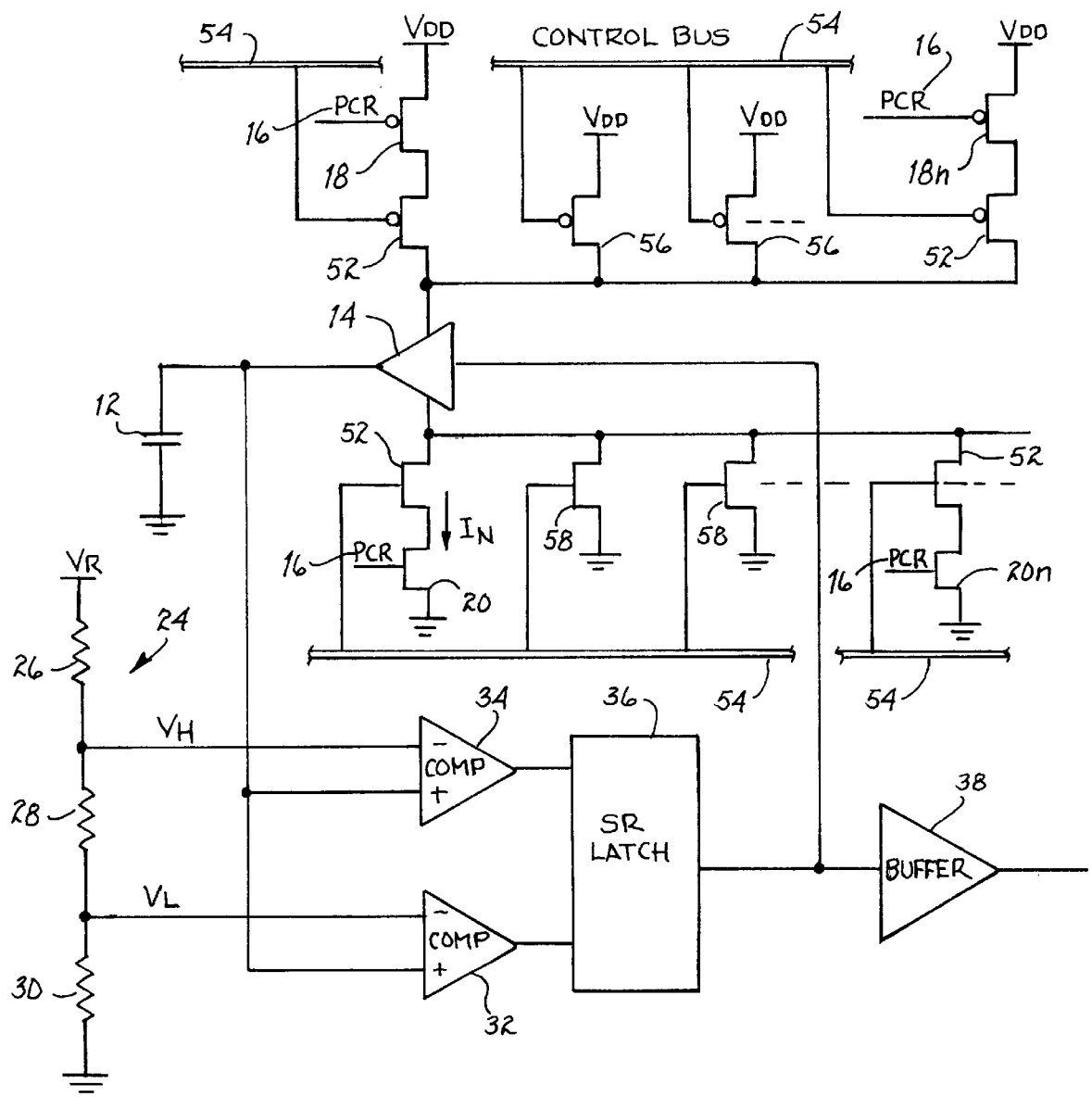
FIG. 2 is a simplified electrical schematic of a second embodiment of the precision oscillator circuit of the present invention.

Referring to FIG. 2 wherein like numerals and symbols represent like elements which function in a similar manner, a second embodiment of the precision oscillator 50 is shown. The embodiment shown in FIG. 2 is very similar to that shown in FIG. 1. The main difference between the two embodiments are the controls used to adjust the currents $I_P$ and $I_N$.

Like the embodiment shown in FIG. 1, a current generator 16 is used for generating a current which is insensitive to temperature, supply voltage, and process variations for the embodiment shown in FIG. 2. In order to control the two currents $I_P$ and $I_N$, one or more P-channel transistors 18 and 18n and one or more N-channel transistors 20 and 20n are coupled to the current generator.

The P-channel transistors 18 and 18n each have drain, gate, and source terminals. The source terminal of the P-channel transistors 18 and 18n are coupled to a bias voltage source $V_{DD}$. The gate terminals of the P-channel transistors 18 and 18n are coupled to the current generator 16. The drain terminals of the P-channel transistors 18 and 18n are individually coupled to separate switches 52. Each of the switches 52 are further coupled to the inverter 14 and to a control bus 54. The switches 52 are used for turning on and turning off the P-channel transistors 18 and 18n. The control bus 54 may be programmed by the manufacturer or the end user in order to activate one or more of the switches 52 which in turn will active a corresponding P-channel transistor 18 or 18n. Thus by programming the control bus 54, the user of the precision oscillator 50 may regulate the level of the current $I_P$ which is used for charging the capacitor 12.

Additional weak P-channel transistors 56 may be provided in order to provide precision calibration of the current $I_P$. Each additional weak P-channel transistor 56 will also have drain, gate, and source terminals. Each weak P-channel transistor 56 are coupled together in a similar manner wherein the source terminals of each weak P-channel transistor 56 are coupled to a bias voltage source $V_{DD}$, the gate terminals of each weak P-channel transistor 56 are coupled to the control bus 54, and the drain terminals of each weak P-channel transistor 56 are coupled to the inverter 14. The control bus 54 will activate and deactivate certain weak P-channel transistor 56 in order to provide precision calibration of the current $I_P$ and thus precision calibration of the output frequency of the latch 36.

The N-channel transistors 20 and 20n regulate the level of the current $I_N$ which is used to discharge the capacitor 12. The N-channel transistors 20 and 20n each have drain, gate, and source terminals. The drain terminals of each of the N-channel transistors 20 and 20n are individually coupled to separate switches 52. The gate terminal of the N-channel transistor 20 is coupled to the current generator 16. The source terminal of the N-channel transistor 20 is coupled to ground. Each of the switches 52 are further coupled to the inverter 14 and to the control bus 54. The switches 52 are used for turning on and turning off the N-channel transistors 20 and 20n. The control bus 54 may be programmed by the manufacturer or the end user in order to activate one or more of the switches 52 which in turn will active a corresponding N-channel transistor 20 or 20n. Thus by programming the control bus 54, the user of the precision oscillator 50 may regulate the level of the current $I_N$ which is used for discharging the capacitor 12.

Additional weak N-channel transistors 58 may be used to provide precision calibration of the current $I_N$. Each additional weak N-channel transistor 58 will have drain, gate, and source terminals. The drain terminals of each weak N-channel transistor 58 are coupled to the inverter 14. The gate terminals of each weak N-channel transistor 58 are coupled to control bus 54. The source terminals of each weak N-channel transistor 58 are coupled to ground. The control bus 54 will allow an individual to activate and deactivate each of the weak N-channel transistors 58. This will allow an individual to provide precision calibration of the current $I_N$ and thus precision calibration of the output frequency of the latch 36.

As with the embodiment shown in FIG. 1, the inverter 14 switches between the two currents $I_P$ and $I_N$. The two currents are used for charging $I_P$ and discharging $I_N$ the capacitor 12. The resulting triangular waveform from charging and discharging the capacitor 12 is fed into the first and second comparators 32 and 34 which will trip at predetermined voltages set by the resistive ladder 24. The outputs of the two comparators 32 and 34 are fed into a latch 36. The output of the latch 36 is the desired frequency and can be run through a buffer 38 to drive larger loads. The output of the latch 36 is also fed back to the inverter 14. The output signal from the latch 36 is used to control the switching of the inverter 14 in order to charge and discharge the capacitor 12.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A precision oscillator circuit having a wide adjustable operating frequency range and an adjustable duty cycle comprising, in combination:

a capacitive element;

a window comparator circuit coupled to said capacitive element for monitoring a voltage of said capacitive element, said window comparator circuit having a first operating voltage edge and a second operating voltage edge wherein said first operating voltage edge latches an output signal of said window comparator circuit at one level when said voltage of said capacitive element is greater than said first operating voltage edge and said second operating voltage edge brings said output signal of said window comparator circuit back to an initial level when said voltage of said capacitive element is greater than said second operating voltage edge; and a precision current reference source coupled to said capacitive element and to said window comparator circuit for generating a first adjustable current and a second adjustable current both of which are insensitive to temperature, supply voltage, and process variations wherein said first adjustable current is used for charging and said second adjustable current is used for discharging said capacitive element, said first adjustable current and said second adjustable current being adjustable to vary an amount of time to charge and discharge said capacitive element to allow altering a frequency and a duty cycle of said output signal of said window comparator circuit, wherein said precision current reference source comprises:

a first current source for generating said first adjustable current which is insensitive to temperature, supply voltage, and process variations to charge said capacitive element;

a second current source for generating said second adjustable current which is insensitive to temperature, supply voltage, and process variations to discharge said capacitive element, wherein said second current source comprises:

a current reference source for generating a current which is insensitive to temperature, supply voltage, and process variations; and at least one N-channel transistor having drain, gate, and source terminals wherein said drain terminal of said at least one N-channel transistor is coupled to a switching element, said gate terminal of said at least one N-channel transistor is coupled to said current reference source, and said source terminal of said at least one N-channel transistor is coupled to around for regulating a level of said second adjustable current to discharge said capacitive element; and the switching element coupled to said first current source, said second current source, said capacitive element, and said window comparator circuit for switching between and outputting said first adjustable current to charge said capacitive element and said second adjustable current to discharge said capacitive element when signalled by said window comparator circuit.

2. A precision oscillator circuit in accordance with claim 1 further comprising a buffer device coupled to said window comparator circuit for filtering unwanted signals from said output signal of said window comparator circuit.

3. A precision oscillator circuit in accordance with claim 1 wherein said window comparator circuit comprises:

a resistive ladder for setting said first operating voltage edge and said second operating voltage edge of said window comparator circuit;

a first comparator having a first input coupled to said resistive ladder and a second input coupled to said capacitive element for generating an output signal when said voltage of said capacitive element is greater than said first operating voltage edge;

a second comparator having a first input coupled to said resistive ladder and a second input coupled to said capacitive element for generating an output signal when said voltage of said capacitive element is greater than said second operating voltage edge; and a latch coupled to said first comparator and said second comparator for generating said output signal which is latched at said one level when said first comparator generates said first comparator output signal indicating said voltage of said capacitive element is greater than said first operating voltage edge, said latch being reset so said output signal returns to said initial value when said second comparator generates said second comparator output signal indicating said voltage of said capacitive element is greater than said second operating voltage edge.

4. A precision oscillator circuit in accordance with claim 3 wherein said resistive ladder comprises:

a first resistor having a first terminal coupled to a voltage source and a second terminal coupled to said first input of said second comparator;

a second resistor having a first terminal coupled to said second terminal of said first resistor and a second terminal coupled to said first input of said first comparator; and a third resistor having a first terminal coupled to said second terminal of said second resistor and a second input coupled to ground.

5. A precision oscillator circuit in accordance with claim 1 wherein said first current source comprises:

at least one P-channel transistor having drain, gate, and source terminals wherein said source terminal of said at least one P-channel transistor is coupled to a bias voltage source, said gate terminal of said at least one P-channel transistor is coupled to said current reference source, and drain terminal of said at least one P-channel transistor is coupled to said switching element for regulating a level of said first adjustable current to charge said capacitive element.

6. A precision oscillator circuit in accordance with claim 5 further comprising a plurality of P-channel transistors having drain, gate, and source terminals wherein said source terminal of each of said plurality of P-channel transistors are coupled to said bias voltage source, said gate terminals of each of said plurality of P-channel transistors are coupled to said current reference source, and each of said drain terminals of said plurality of P-channel transistors are coupled to said switching element for regulating said level of said first adjustable current to charge said capacitive element.

7. A precision oscillator circuit in accordance with claim 1 further comprising a plurality of N-channel transistors having drain, gate, and source terminals wherein said drain terminal of each of said plurality of N-channel transistors are coupled to said switching element, said gate terminals of each of said plurality of N-channel transistors are coupled to said current reference source, and said source terminals of each of said plurality of N-channel transistors are coupled to said ground for regulating said level of said second adjustable current to discharge said capacitive element.

8. A precision oscillator circuit in accordance with claim 1 wherein said first current source comprises:

a control bus for activating and deactivating said P-channel transistor to regulate said first adjustable current to charge said capacitive element; and a switch coupled to said P-channel transistor and said control bus for activating and deactivating said P-channel transistor when signalled by said control bus.

9. A precision oscillator circuit in accordance with claim 8 further comprising at least one weak P-channel transistor having drain, gate, and source terminals wherein said source terminal of said at least one weak P-channel transistor is coupled to said bias voltage source, said gate terminal of said at least one weak P-channel transistor is coupled to said control bus, and said drain terminal of said at least one weak P-channel transistor is coupled to said switching element for precision calibration of said level of said first adjustable current to charge said capacitive element.

10. A precision oscillator circuit in accordance with claim 9 further comprising a plurality of weak P-channel transistors having drain, gate, and source terminals wherein said source terminals of each of said plurality of weak P-channel transistors are coupled to said bias voltage source, said gate terminals of each of said plurality of weak P-channel transistors are coupled to said control bus, and said drain terminals of each of said plurality of weak P-channel transistors are coupled to said switching element for precision calibration of said level of said first adjustable current to charge said capacitive element.

11. A precision oscillator circuit in accordance with claim 10 further comprising:

a plurality of P-channel transistors having drain, gate, and source terminals wherein said source terminals of each of said plurality of P-channel transistors are coupled to said bias voltage source, said gate terminals of each of said plurality of P-channel transistors are coupled to said current reference source, and said drain terminals of each of said plurality of P-channel transistors are coupled to said switching element for regulating said level of said first adjustable current to charge said capacitive element; and a plurality of switches equal in number to said plurality of P-channel transistors wherein each of said plurality of switches elements are individually coupled to a separate and different one of said plurality of P-channel transistors and to said control bus for activating and deactivating each of said plurality of P-channel transistors when signalled by said control bus to regulating said level of said first adjustable current to charge said capacitive element.

12. A precision oscillator circuit in accordance with claim 1 wherein said second current source comprises:

a control bus for activating and deactivating said N-channel transistor for regulating said second adjustable current to discharge said capacitive element; and a switch coupled to said N-channel transistor and said control bus for activating and deactivating said N-channel transistor when signalled by said control bus.

13. A precision oscillator circuit in accordance with claim 12 further comprising at least one weak N-channel transistor having drain, gate, and source terminals wherein said drain terminal of said at least one weak N-channel transistor is coupled to said switching element, said gate terminal of said at least one weak N-channel transistor is coupled to said control bus, and said source terminal of said at least one weak N-channel transistor is coupled to said ground for precision calibration of said level of said second adjustable current to discharge said capacitive element.

14. A precision oscillator circuit in accordance with claim 13 further comprising a plurality of weak N-channel transistors having drain, gate, and source terminals wherein said drain terminals of each of said plurality of weak N-channel transistors are coupled to said switching element, said gate terminals of each of said plurality of weak N-channel transistors are coupled to said control bus, and said source terminals of each of said plurality of weak N-channel transistors are coupled to said ground for precision calibration of said second level of said adjustable current to discharge said capacitive element.

15. A precision oscillator circuit in accordance with claim 14 further comprising:

a plurality of N-channel transistors having drain, gate, and source terminals wherein said drain terminals of each of said plurality of N-channel transistors are coupled to said switching element, said gate terminals of each of said plurality of N-channel transistors are coupled to said current reference source, and said source terminals of each of said plurality of N-channel transistors are coupled to said ground for regulating said level of said second adjustable current to discharge said capacitive element; and a plurality of switch elements equal in number to said plurality of N-channel transistors wherein each of said plurality of switch elements are individually coupled to a separate and different one of said plurality of N-channel transistors and to said control bus for activating and deactivating each of said plurality of N-channel transistor when signalled by said control bus to regulating said level of said second adjustable current to discharge said capacitive element.

16. A precision oscillator circuit having a wide adjustable operating frequency range and an adjustable duty cycle comprising, in combination:

a capacitive element;

a window comparator circuit coupled to said capacitive element for monitoring a voltage of said capacitive element, said window comparator circuit having a first operating voltage edge and a second operating voltage edge wherein said first operating voltage edge latches an output signal of said window comparator circuit at one level when said voltage of said capacitive element is greater than said first operating voltage edge and said second operating voltage edge brings said output signal of said window comparator circuit back to an initial level when said voltage of said capacitive element is greater than said second operating voltage edge, said window comparator circuit comprising:

a resistive ladder for setting said first operating voltage edge and said second operating voltage edge of said window comparator circuit, said resistive ladder comprising:

a first resistor having a first terminal coupled to a voltage source and a second terminal coupled to said first input of said second comparator;

a second resistor having a first terminal coupled to said second terminal of said first resistor and a second terminal coupled to said first input of said first comparator; and a third resistor having a first terminal coupled to said second terminal of said second resistor and a second terminal coupled to ground;

a first comparator having a first input coupled to said resistive ladder and a second input coupled to said capacitive element for generating a first comparator output signal when said voltage of said capacitive element is greater than said first operating voltage edge;

a second comparator having a first input coupled to said resistive ladder and a second input coupled to said capacitive element for generating a second comparator output signal when said voltage of said capacitive element is greater than said second operating voltage edge; and a latch coupled to said first comparator and said second comparator for generating said output signal which is latched at said one level when said first comparator generates said output signal indicating said voltage of said capacitive element is greater than said first operating voltage edge, said latch being reset so said output signal returns to said initial value when said second comparator generates said second comparator output signal indicating said voltage of said capacitive element is greater than said second operating voltage edge;

a precision current reference source coupled to said capacitive element and to said window comparator circuit for generating a first adjustable current and a second adjustable current which are insensitive to temperature, supply voltage, and process variations wherein said first adjustable current is used for charging and said second adjustable current is used for discharging said capacitive element, said first adjustable current and said second adjustable current being adjustable to vary an amount of time to charge and discharge said capacitive element to allow altering a frequency and a duty cycle of said output signal of said window comparator circuit, said precision current reference source comprising:

a first current source for generating said first adjustable current which is insensitive to temperature, supply voltage, and process variations to charge said capacitive element wherein said first current source comprises:

a current reference source for generating a current which is insensitive to temperature, supply voltage, and process variations; and at least one P-channel transistor having drain, gate, and source terminals wherein said source terminal of said at least one P-channel transistor is coupled to a bias voltage source, said gate terminal of said at least one P-channel transistor is coupled to said current reference source, and said drain terminal of said at least one P-channel transistor is coupled to a switching element for regulating a level of said first adjustable current to charge said capacitive element;

a second current source for generating said second adjustable current which is insensitive to temperature, supply voltage, and process variations to discharge said capacitive element wherein said second current source comprises at least one N-channel transistor having drain, gate, and source terminals wherein said drain terminal of said at least one N-channel transistor is coupled to said switching element, said gate terminal of said at least one N-channel transistor is coupled to said current reference source, and said source terminal of said at least one N-channel transistor is coupled to ground for regulating a level of said second adjustable current to discharge said capacitive element; and said switching element coupled to said first current source, said second current source, said capacitive element, and said window comparator circuit for switching between and outputting said first adjustable current to charge said capacitive element and said second adjustable current to discharge said capacitive element when signalled by said window comparator circuit; and a buffer device coupled to said window comparator circuit for filtering unwanted signals from said output signal of said window comparator circuit.

17. A precision oscillator circuit in accordance with claim 16 further comprising a plurality of P-channel transistors having drain, gate, and source terminals wherein said source terminal of each of said plurality of P-channel transistors are coupled to said bias voltage source, said gate terminals of each of said plurality of P-channel transistors are coupled to said current reference source, and each of said drain terminals of said plurality of P-channel transistors are coupled to said switching element for regulating said level of said first adjustable current to charge said capacitive element.

18. A precision oscillator circuit in accordance with claim 16 further comprising a plurality of N-channel transistors having drain, gate, and source terminals wherein said drain terminal of each of said plurality of N-channel transistors are coupled to said switching element, said gate terminals of each of said plurality of N-channel transistors are coupled to said current reference source, and source terminals of each of said plurality of N-channel transistors are coupled to said ground for regulating said level of said second adjustable current to discharge said capacitive element.

19. A precision oscillator circuit in accordance with claim 16 wherein said first current source comprises:

a control bus for activating and deactivating said P-channel transistor to regulate said first adjustable current to charge said capacitive element; and a switch coupled to said P-channel transistor and said control bus for activating and deactivating said P-channel transistor when signalled by said control bus.

20. A precision oscillator circuit in accordance with claim 19 further comprising at least one weak P-channel transistor having drain, gate, and source terminals wherein said source terminal of said at least one weak P-channel transistor is coupled to said bias voltage source, said gate terminal of said at least one weak P-channel transistor is coupled to said control bus, and said drain terminal of said at least one weak P-channel transistor is coupled to said switching element for precision calibration of said level of said first adjustable current to charge said capacitive element.

21. A precision oscillator circuit in accordance with claim 20 further comprising a plurality of weak P-channel transistors having drain, gate, and source terminals wherein said source terminals of each of said plurality of weak P-channel transistors are coupled to said bias voltage source, said gate terminals of each of said plurality of weak P-channel transistors are coupled to said control bus, and said drain terminals of each of said plurality of weak P-channel transistors are coupled to said switching element for precision calibration of said level of said first adjustable current to charge said capacitive element.

22. A precision oscillator circuit in accordance with claim 21 further comprising:

a plurality of P-channel transistors having drain, gate, and source terminals wherein said source terminals of each of said plurality of P-channel transistors are coupled to said bias voltage source, said gate terminals of each of said plurality of P-channel transistors are coupled to said current reference source, and said drain terminals of each of said plurality of P-channel transistors are coupled to said switching element for regulating said level of said first adjustable current to charge said capacitive element; and a plurality of switches equal in number to said plurality of P-channel transistors wherein each of said plurality of switches elements are individually coupled to a separate and different one of said plurality of P-channel transistors and to said control bus for activating and deactivating each of said plurality of P-channel transistors when signalled by said control bus to regulating said level of said first adjustable current to charge said capacitive element.

23. A precision oscillator circuit in accordance with claim 19 wherein said second current source comprises:

a switch coupled to said N-channel transistor and said control bus for activating and deactivating said N-channel transistor when signalled by said control bus.

24. A precision oscillator circuit in accordance with claim 23 further comprising at least one weak N-channel transistor having drain, gate, and source terminals wherein said drain terminal of said at least one weak N-channel transistor is coupled to said switching element, said gate terminal of said at least one weak N-channel transistor is coupled to said control bus, and said source terminal of said at least one weak N-channel transistor is coupled to said ground for precision calibration of said level of said second adjustable current to discharge said capacitive element.

25. A precision oscillator circuit in accordance with claim 24 further comprising a plurality of weak N-channel transistors having drain, gate, and source terminals wherein said drain terminals of each of said plurality of weak N-channel transistors are coupled to said switching element, said gate terminals of each of said plurality of weak N-channel transistors are coupled to said control bus, and said source terminals of each of said plurality of weak N-channel transistors are coupled to said ground for precision calibration of said level of said second adjustable current to discharge said capacitive element.

26. A precision oscillator circuit in accordance with claim 25 further comprising:

a plurality of N-channel transistors having drain, gate, and source terminals wherein said drain terminals of each of said plurality of N-channel transistors are coupled to said switching element, said gate terminals of each of said plurality of N-channel transistors are coupled to said current reference source, and said source terminals of each of said plurality of N-channel transistors are coupled to said ground for regulating said level of said second adjustable current to discharge said capacitive element; and a plurality of switch elements equal in number to said plurality of N-channel transistors wherein each of said plurality of switch elements are individually coupled to a separate and different one of said plurality of N-channel transistors and to said control bus for activating and deactivating each of said plurality of N-channel transistor when signalled by said control bus to regulating said level second adjustable current to discharge said capacitive element.

* * * * *